(12) United States Patent
Venkata et al.

(10) Patent No.: US 7,272,677 B1
(45) Date of Patent: Sep. 18, 2007

(54) MULTI-CHANNEL SYNCHRONIZATION FOR PROGRAMMABLE LOGIC DEVICE SERIAL INTERFACE

(75) Inventors: Ramanand Venkata, San Jose, CA (US); Chong H Lee, San Roman, CA (US); Rakesh Patel, Cupertino, CA (US)

(73) Assignee: Altera Corporation, San Jose, CA (US)

(*) Notice: Subject to any disclaimer, the term of this patent is extended or adjusted under 35 U.S.C. 154(b) by 564 days.

(21) Appl. No.: 10/637,982

(22) Filed: Aug. 8, 2003

(51) Int. Cl.
*G06F 3/00* (2006.01)
*G06F 13/12* (2006.01)

(52) U.S. Cl. .................. 710/71; 710/1; 710/62; 710/65

(58) Field of Classification Search .................. None
See application file for complete search history.

(56) References Cited

U.S. PATENT DOCUMENTS

| | | | |
|---|---|---|---|
| 3,473,160 A | 10/1969 | Wahlstrom | 326/41 |
| 4,486,739 A | 12/1984 | Franaszek et al. | 341/59 |
| 5,689,195 A | 11/1997 | Cliff et al. | 326/41 |
| 5,802,103 A | 9/1998 | Jeong | 375/220 |
| 5,909,126 A | 6/1999 | Cliff et al. | 326/41 |
| 6,031,428 A | 2/2000 | Hill | 331/11 |
| 6,215,326 B1 | 4/2001 | Jefferson et al. | 326/41 |
| 6,240,471 B1 | 5/2001 | Schlueter et al. | 710/62 |
| 6,270,350 B1 | 8/2001 | Christopher | 434/69 |
| 6,370,603 B1 | 4/2002 | Silverman | 710/72 |
| 6,388,591 B1 | 5/2002 | Ng | 341/100 |
| 6,407,576 B1 | 6/2002 | Ngai et al. | 326/41 |
| 6,512,804 B1 * | 1/2003 | Johnson et al. | 375/372 |
| 6,618,395 B1 * | 9/2003 | Kimmitt | 370/473 |
| 2001/0033188 A1 * | 10/2001 | Aung et al. | 327/141 |
| 2002/0190751 A1 | 12/2002 | Lee et al. | 326/39 |
| 2003/0052709 A1 | 3/2003 | Venkata et al. | 326/37 |
| 2003/0155955 A1 | 8/2003 | Andrasic et al. | 327/277 |

OTHER PUBLICATIONS

Agere Systems, Inc.; "ORCA ORT82G5 1.0-1.25/2.0-2.5/3.125 Gbits/s Backplane Interface FPSC;" Jul. 2001; Preliminary Data Sheet; pp. 1-35.*
Victor P. Nelson et al.; Digital Logic Circuit Analysis & Design; 1995; Prentice-Hall, Inc.; pp. 131-132.*
Agere Systems, Inc., "ORCA ORT82G5 1.0-1.25/2.0-2.5/3.125 Gbits/s Backplane Interface FPSC," Preliminary Data Sheet, pp. 1-35 (Jul. 2001).

(Continued)

*Primary Examiner*—Mano Padmanabhan
*Assistant Examiner*—Richard B. Franklin, Jr.
(74) *Attorney, Agent, or Firm*—Ropes & Gray LLP; Jeffrey H. Ingerman

(57) ABSTRACT

A serial interface for a programmable logic device substantially eliminates skew across multiple channels both in the receiver and in the transmitter. Even when the channels are independent (e.g., are in different quads), skew is substantially eliminated by monitoring to determine when all channels have reached their active states (i.e., in the case of receiver channels when all channels have achieved byte alignment and have received an alignment character, and in the case of transmitter channels when all transmit PLLs have locked), and only then allowing data to flow between the serial and parallel domains.

70 Claims, 10 Drawing Sheets

OTHER PUBLICATIONS

Agere Systems, Inc., "ORCA ORT8850 Field-Programmable System Chip (FPSC) Eight Channel x 850 Mbits/s Backplane Transceiver," Product Brief, pp. 1-6 (Jul. 2001).

Agere Systems, Inc., "ORCA ORT8850 Field-Programmable System Chip (FPSC) Eight Channel x 850 Mbits/s Backplane Transceiver," Product Brief, pp. 1-36 (Aug. 2001).

Cook, Barry M., "IEEE 1355 Data-Strobe Links: ATM Speed at RS232 Cost," *Microprocessors and Microsystems*, vol. 21, No. 7-8, pp. 421-428 (Mar. 30, 1998).

Electronic Trend Publications, Inc., "Lucent Introduces 10Gb/s Ethernet FPGAs," *Programmable Logic* News and Views, vol. 9, No. 11, pp. 7-8 (Nov. 2000).

Konstas, Jason, "Converting Wide, Parallel Data Buses to High Speed Serial Links," *International IC '99 Conference Proceedings*, pp. 19-30 (1991).

Lucent Technologies, Inc., "Protocol Independent Gigabit Backplane Transceiver Using Lucent ORT4622/ORT8850 FPSCs," Application Note, pp. 1-10 (Jun. 2000).

Lucent Technologies, Inc., "ORCA ORT82G5 0.622/1.0-1.25/2.0-2.5/3.125 Gbits/s Backplane Interface FPSC," Product Brief, pp. 1-8 (Feb. 2001).

Xilinx, Inc., *Virtex-II Pro Platform FPGA Handbook* (UG012 Version 1.0), pp. 1-6, 27-32, 121-126, and 162-180 (Jan. 31, 2002).

Xilinx, Inc., Rocket I/O Transceiver User Guide (UG024 Version 1.2), pp. 1-106 (Feb. 25, 2002).

* cited by examiner

MULTI-CHANNEL SYNCHRONIZATION FOR PROGRAMMABLE LOGIC DEVICE SERIAL INTERFACE

BACKGROUND OF THE INVENTION

This invention relates to synchronization across multiple channels in a high-speed serial interface, especially in a programmable logic device. More particularly, this invention relates to synchronization of either multiple receiver channels or multiple transmit channels, especially in a programmable logic device when not all channels may be used.

Recently PLDs have begun to incorporate high-speed serial interfaces to accommodate high-speed (i.e., greater than 1 Gbps) high-speed serial I/O standards—e.g., the XAUI (10 Gbps Extended Attachment Unit Interface) standard. In accordance with the XAUI standard, a high-speed serial interface includes transceiver groups known as "quads," each of which includes four transceivers and some central logic. Within each transceiver, the receiver portion typically includes a phase-locked loop ("PLL"), primarily for the purpose of enabling clock data recovery from a received high-speed serial signal. In addition, the central logic typically includes a PLL, primarily for the purpose of generating a transmit clock to be used by the transmitter portion of each of the four transceivers, and in some cases for generating a reference clock for the receiver PLLs.

In most cases, the individual receivers or transmitters in a quad are intended to be used together, for multi-channel reception or transmission of related signals. However, because of skew on the device on which the various receivers or transceivers are provided, there may be difficulties in synchronizing across the various channels. For example, in the case of reception on multiple channels under the XAUI standard, successive bytes or words of a message are sent on successive channels in a "round robin" scheme. Align characters preferably are sent substantially simultaneously on each channel. Although the multiple channels may have been aligned at the source, data converted from the serial domain back to the parallel domain on the received channels may be misaligned as a result of skew between the channels. Similarly, in the case of transmission from the parallel domain to the serial domain, it is desirable for the serial output clocks of the various channels to be aligned within one period or "unit interval (UI)." However, if different channels are ready to transmit at different times, and each channel simply begins transmitting when it is ready, the clocks can easily be misaligned by more than one UI.

While it is known to provide solutions for such synchronization problems when all receivers or transmitters are in a single quad, there may be applications in which receivers or transmitters are spread across multiple quads. It would be desirable to be able to provide synchronization across multiple channels, even across quad boundaries.

SUMMARY OF THE INVENTION

The present invention provides high-speed serial interface circuitry on a programmable logic device that is more flexible than previously known high-speed serial interfaces in that different channels can be synchronized, even across quad boundaries. This is accomplished by providing synchronization circuitry that determines when all desired ones of the channels are active, or ready, and, when all desired channels are active or ready, initiates communication on each channel between the serial domain and the parallel domain (i.e., from the serial domain to the parallel domain in the case of a receiver, and from the parallel domain to the serial domain in the case of a transmitter).

In the case of receivers, in one embodiment each receiver preferably includes a FIFO storage device that holds or stores the parallel words or bytes converted from the incoming serial bit data. In accordance with an embodiment of the present invention, the data words for each channel preferably are held in the respective FIFO for that channel until it is determined that all channels have locked on their respective clocks and are holding data words in their FIFOs, whereupon the data words preferably are released, for use "round robin" style if appropriate, under control of the respective clocks, starting with the respective align characters.

A preferred embodiment of a mechanism for determining that all receiver channels are locked includes a synchronization status output from the byte alignment circuitry of each receiver. For each receiver, that "sync status" signal is ANDed with a cascade of ANDed such signals from neighboring channels. The result of that AND operation in the last of the channels preferably is used as a read-enable signal for the FIFOs of all of the channels.

In a particularly preferred embodiment, the cascade input of each sync status AND gate is selectable (e.g., via a multiplexer or OR gate) between the cascade signal or a permanent "high" signal. Selecting the high signal effectively ignores all sync status signals further up the cascade, thereby providing the ability to eliminate those channels from the grouping being synchronized. It should similarly be noted that the output of any sync status AND gate can be tapped as the read-enable signal, allowing channels further down the cascade to be eliminated from the grouping. Thus, according to this embodiment, any contiguous subset of channels can be synchronized. In fact, a plurality of contiguous subsets of channels can be grouped, and each subset can be synchronized separately from the others.

In another preferred embodiment, even a noncontiguous subset of channels can be synchronized. This embodiment is similar to the previous embodiment that allows a contiguous subset of channels to be synchronized, except that not only does the cascade input to the sync status AND gate have a selectable input, but so does the input for the status of the channel of which the AND gate is a part. If a channel's status input is selected to be permanently high, that channel's status is ignored and the channel is effectively removed from the cascade, without removing the channels above it. In this way, any noncontiguous group of channels can be synchronized, but this embodiment can also be used for a contiguous group of channels. However, unless a plurality of cascade chains is provided, the ability of this arrangement to provide complete freedom in selecting channels to be included in multiple cascades is limited. In fact, a plurality of groupings of noncontiguous channels using a single cascade chain is possible only if the channels in each grouping are not interleaved with the channels of other groupings—i.e., each grouping is a contiguous or noncontiguous subset of a collection of contiguous channels, with each collection of contiguous channels being a contiguous subset of the total number of channels.

In both of the foregoing embodiments, the enable signal—i.e., the output of the last AND gate in the cascade—must be communicated to all channels in the grouping as the read-enable signal for the FIFO of each channel in the group.

In one embodiment, the read-enable signal is conducted by a repeater line, which is a conductor broken at each channel boundary by a repeater that can be set to pass a signal in only one of two directions, or not at all. This embodiment is useful only with one or more contiguous channel groupings, because each repeater can stop the read-enable signal at a channel boundary, but cannot be used to skip a channel. Therefore this embodiment is useful with the embodiment described above for providing a contiguous channel grouping or groupings, and also is useful for a noncontiguous grouping or groupings as long as skipped channels are not being used and as long as, in the case of multiple groupings, the channels of the multiple groupings are not interleaved as defined above.

In another embodiment, a routing network having a plurality of conductors which can be switchably connected to the read-enable signal output of the AND-gate cascade, and to the read-enable signal inputs of the FIFOs of the individual channels, is provided. This embodiment works with both interleaved and non-interleaved groupings, and the number of groupings that can be accommodated is limited only by the number of conductors in the routing network.

In the case of transmitters, in a preferred embodiment of the type used with the XAUI standard as described above, synchronization of the transmit clock as among individual channels in a single quad is not normally of concern, insofar as normally in such an arrangement there is only one transmit PLL per quad providing the serial transmit clock and one clock divider deriving the parallel transmit clock from the serial transmit clock, and all channels within the quad use the same transmit clocks. However, if channels are grouped across quad boundaries (whether or not all channels in each involved quad are part of the grouping), then synchronization of the transmit clocks generally is required. For groupings across quad boundaries, it normally would be expected that all involved quads are in the same clock domain—i.e., that the transmit PLLs in the grouped quads share a common reference clock.

In a preferred embodiment for transmitter synchronization, the lock status output of the transmit PLL in each quad in which there is at least one involved channel is monitored. The clock dividers in each of the involved quads are not enabled until the transmit PLLs in all of the involved quads are locked. In this way, the clock dividers preferably are enabled within one serial period, or serial unit interval, of each other.

Preferably, in such an embodiment the circuitry for monitoring the lock status of the transmit PLLs in the various quads is constructed from programmable logic in the logic core of the PLD. For example, an n-input AND gate, where n is the number of quads involved, can be used to monitor the PLL lock status, with the output of the n-input AND gate being the clock-enable signal for the various clock dividers.

In order for the serial clocks of the various grouped quads to be within one serial UI as desired, the clock-enable signal preferably should reach the clock dividers of all quads as close to the same time as possible. One way to accomplish this is to conduct the clock-enable signal to a plurality of registers, each adjacent one of the grouped quads, and then to clock the clock-enable signal out of those registers substantially simultaneously using a single low-skew global clock of the PLD. Preferably the clock-enable signal is conducted to the various registers with as little skew as possible, and in event it should reach all registers within the same cycle of the global clock. Another way to accomplish this is to distribute the clock-enable signal using a low-skew balanced distribution network similar to a low-skew balanced clock tree.

Therefore, in accordance with the present invention, there is provided a serial interface for use in a programmable logic device. The serial interface includes a plurality of channels, each of the channels communicating between a parallel domain clocked by a parallel clock and a serial domain clocked by a serial clock that is a multiple of the parallel clock. The serial interface further includes synchronization circuitry that, when all desired ones of the channels are in an active state, initiates communication in each of the desired ones of the channels between the parallel domain and the serial domain. The interface can be either a transmitter or a receiver, or can include both. A programmable logic device incorporating such an interface is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention synchronizes multiple channels of a serial interface in a PLD by monitoring each channel to determine when all channels have achieved an active state, and only then allowing communication between the serial domain and the parallel domain. The invention is useful in both the receiver portion (serial domain to parallel domain) and the transmitter portion (parallel domain to serial domain) of such a serial interface.

In the case of a receiver, the indication of an active state is detection of a channel alignment character after byte alignment has occurred, while in the case of a transmitter, the indication of an active state is detection of a lock signal from the transmitter PLL. Similarly, in the case of a receiver, allowing communication between the serial domain and the parallel domain refers to enabling the reading out from a FIFO memory of data bytes converted from input serial data, while in the case of a transmitter, allowing communication between the serial domain and the parallel domain refers to enabling a clock divider on the transmitter PLL output to provide a parallel clock so that data can be transmitted from the parallel domain.

The invention will now be described with reference to FIGS. 1-11.

Figure 1:
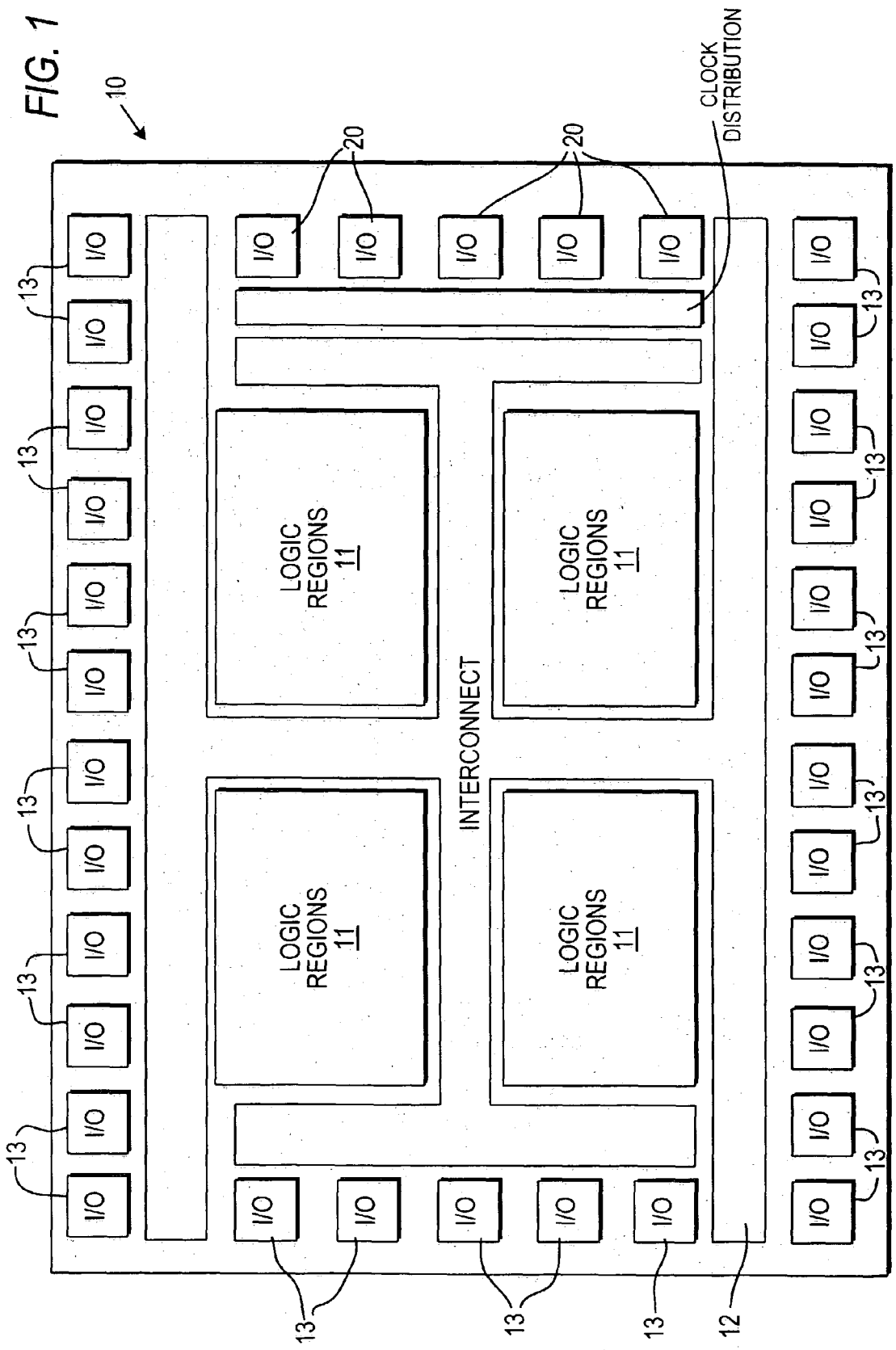
FIG. 1 is a block diagram of a preferred embodiment of a programmable logic device incorporating the present invention.

PLD 10, shown schematically in FIG. 1, is one example of a device incorporating a serial interface 20 according to the invention. PLD 10 has a the programmable logic core including programmable logic regions 11 accessible to programmable interconnect structure 12. The layout of regions 11 and interconnect structure 12 as shown in FIG. 1 is intended to be schematic only, as many actual arrangements are known to, or may be created by, those of ordinary skill in the art.

PLD 10 also includes a plurality of other input/output ("I/O") regions 13. I/O regions 13 preferably are programmable, allowing the selection of one of a number of possible I/O signaling schemes, which may include differential and/or non-differential signaling schemes. Alternatively, I/O regions 13 may be fixed, each allowing only a particular signaling scheme. In some embodiments, a number of different types of fixed I/O regions 13 may be provided, so that while an individual region 13 does not allow a selection of signaling schemes, nevertheless PLD 10 as a whole does allow such a selection.

Figure 2:
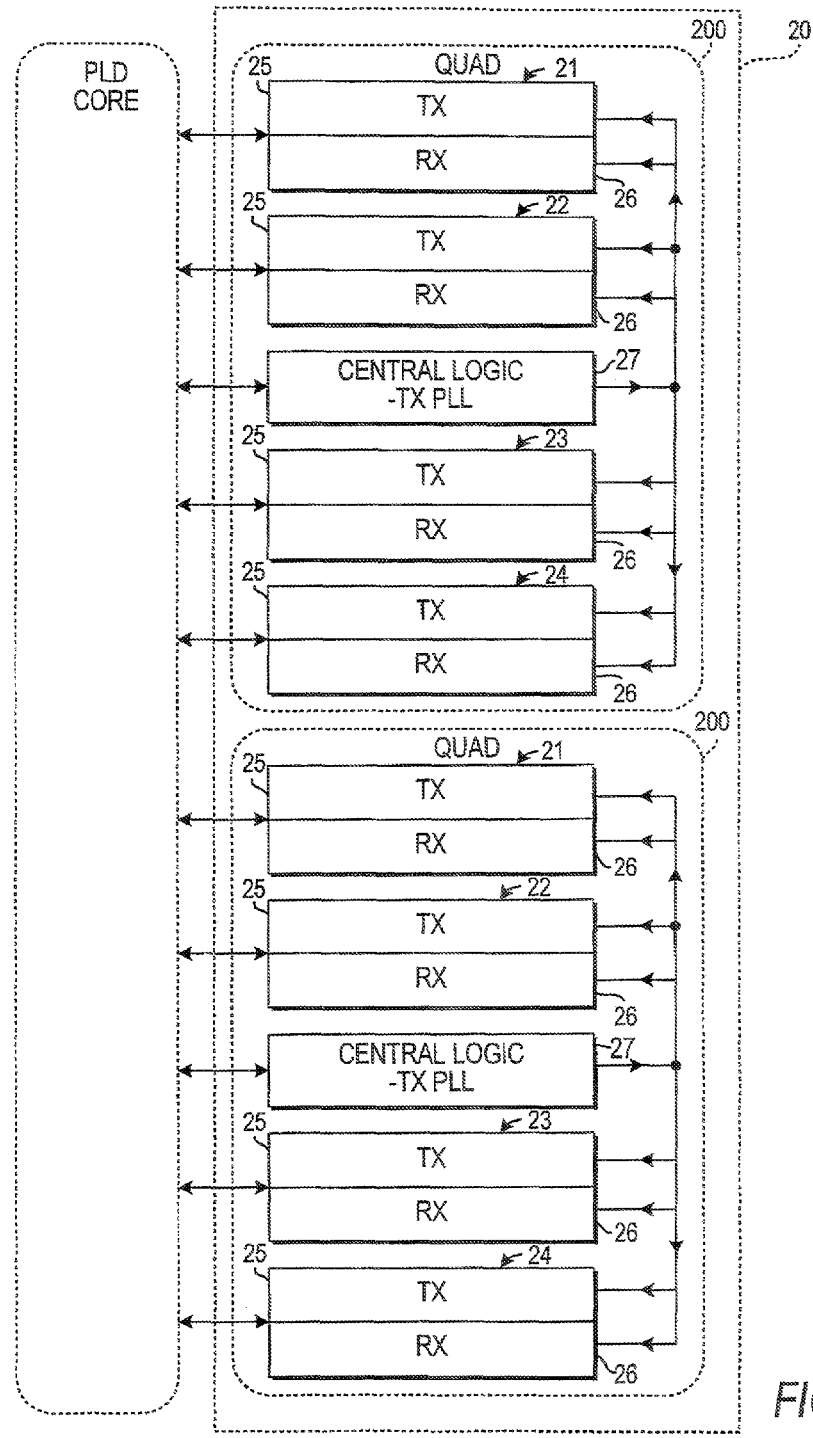
FIG. 2 is a schematic diagram of a serial interface incorporating the present invention.

For example, each I/O region 20 preferably is a high-speed serial interface as described above, similar to an interface capable of implementing the XAUI standard. Thus, as shown in FIG. 2, each interface 20 preferably includes a plurality of groupings 200 having four channels 21-24, each including a transmitter 25 and a receiver 26, as well as central logic 27. As discussed above, because each such grouping includes four channels, it may be referred to as a "quad." However, it should be understood that in accordance with the present invention, which is not linked to any particular high-speed serial standard, each grouping 200 can include any number of channels. Similarly, while each region 20 is shown to contain two groupings 200, each region 20 may contain any number of groupings 200 greater than or equal to two.

As shown in FIG. 1, PLD 10 includes five interfaces 20. However, PLD 10 may include any desired number of interfaces 20, with a corresponding number of channels.

Within each interface 20, all transmitters 25 preferably are identical, and all receivers 26 preferably are identical, and preferably are substantially similar to known high-speed serial interface transmitters and receivers such as those used with the XAUI standard. It should be noted that any differences between transmitter 25 or receiver 26 and known high-speed serial transmitters and receivers preferably maintain compatibility with existing standards such as the XAUI standard, while adding capabilities as described herein.

Figure 3:
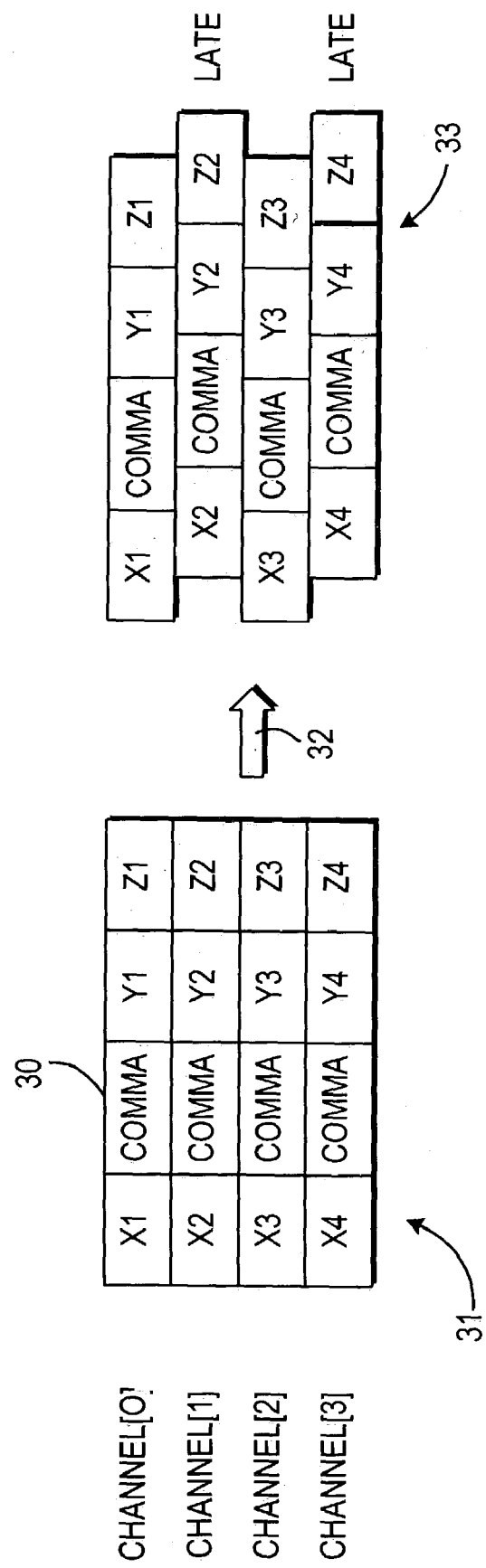
FIG. 3 is a graphic representation of an alignment problem requiring receiver synchronization according to the present invention.

FIG. 3 shows the affect of skew on four channels (channel 0, channel 1, channel 2 and channel 3) of data that originally are aligned but are misaligned after being processed in different receivers that do not incorporate the present invention. As shown, each channel n includes a plurality of fields $X_{n+1}$, $Y_{n+1}$, $Z_{n+1}$, as well as a channel alignment character 30. Although channel alignment character 30 is identified in FIG. 3 by the legend "COMMA," it may be any predetermined character. As seen in the left-hand portion 31 of FIG. 3, all of fields $X_{n+1}$, $Y_{n+1}$, $Z_{n+1}$, as well as channel alignment character 30 originate in a state of alignment across all four channels at their source, but as seen in right-hand portion 33, after passage through whatever route (indicated by arrow 32) by which they are conducted to receivers 26, the various fields and the alignment character are no longer aligned. In the particular example shown, channels 0 and 2 remain aligned, while channels 1 and 3 are late relative to channels 0 and 2, although channels 1 and 3 remain aligned relative to each other. It will be appreciated that in practice, each channel that is delayed could be delayed by a different amount, and in many cases all channels would be affected by delay. As stated above, for a standard, such as the XAUI standard, in which bytes are read "round-robin" style from all channels, channel alignment is required for proper reconstruction of the data.

Figure 4:
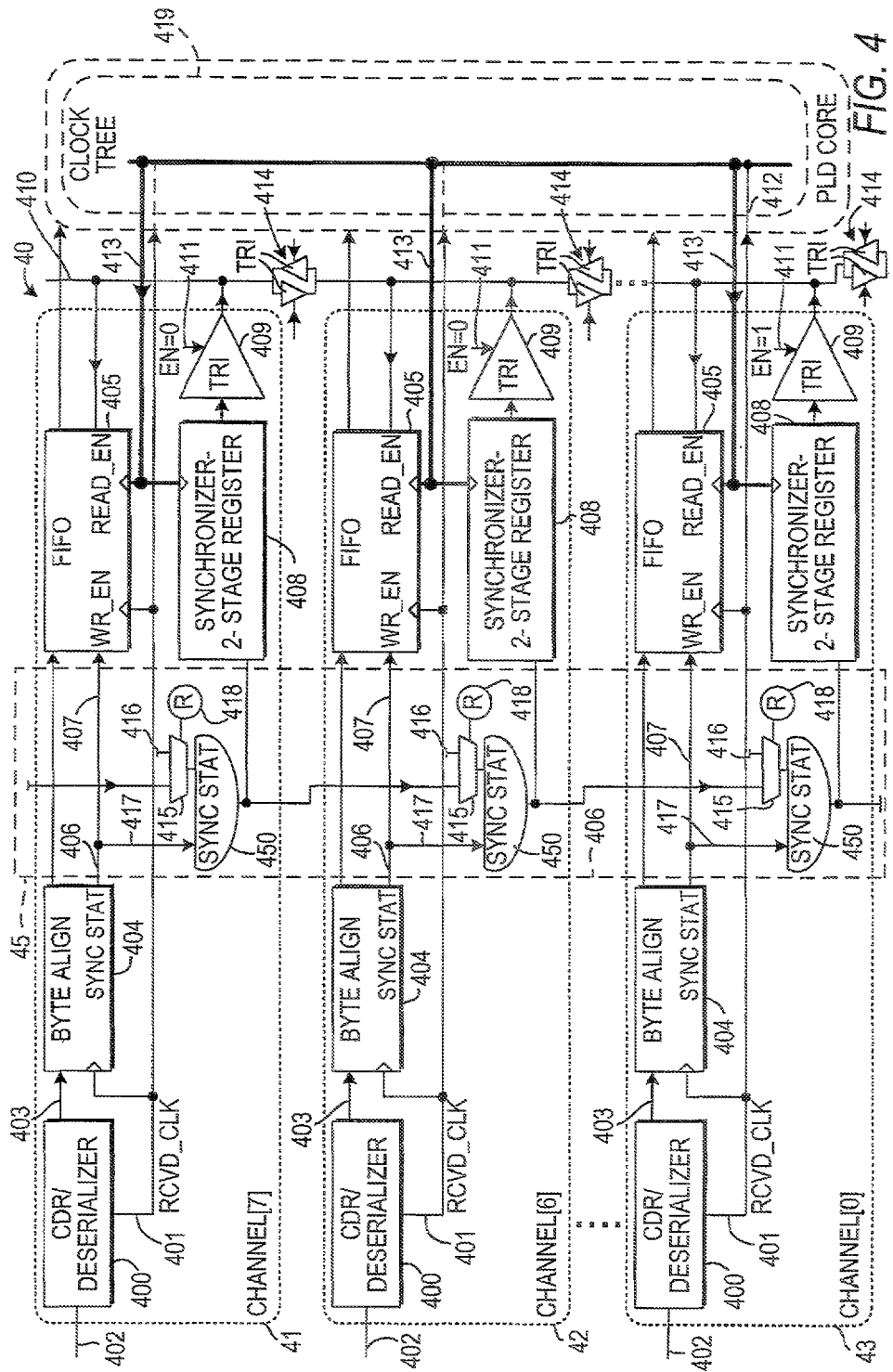
FIG. 4 is a schematic diagram of a first preferred embodiment of a receiver of the serial interface of FIG. 3.

One embodiment of the receiver portion 40 of a serial interface that solves the alignment problem is shown in FIG. 4, in which three channels 41-43 of an eight-channel receiver are shown. Each channel preferably includes a CDR/Deserializer stage 400 which recovers a clock signal 401 from the incoming serial data 402 and converts serial data 402 to parallel data 403. Recovered clock signal 401 is used by subsequent stages 404, 405 of the channel, and also is made available to clock tree 44 in the programmable logic core of PLD 10 for whatever purpose the user configuration may require it as well as for the specific purpose described below.

In byte alignment stage 404, the byte boundaries of parallel data 403 are identified using techniques such as those described in copending, commonly-assigned U.S. patent application Ser. No. 10/454,626, filed Jun. 3, 2003, which is hereby incorporated by reference in its entirety. When the byte boundaries have been aligned, and alignment character 30 has been detected, byte alignment stage 404 preferably asserts SYNC STAT (i.e., synchronization status) signal 406. SYNC STAT signal 406 serves as the write-enable input 407 to FIFO storage device 405. Thus, when SYNC STAT signal 406 is asserted, meaning that byte alignment stage 404 has identified the boundaries of parallel data 403 and detected alignment character 30, FIFO 405 begins to store data, with alignment character 30 in the first position under control of recovered clock signal 401 which functions as the write clock for FIFO 405. This occurs separately in each channel 41-43 (as well as the remaining channels that are not shown).

In this preferred embodiment, SYNC STAT signal 406 of each channel 41-43 (as well as the remaining channels that are not shown) is input into synchronization cascade circuitry 45 which facilitates a determination that all channels of interest have achieved synchronization, so that reading of the data in the various FIFOs 405 may begin. In this embodiment, synchronization cascade circuitry 45 preferably includes a respective two-input AND gate 450 in each of channels 41-43 (as well as the remaining channels that are not shown). One input ("the channel input") of AND gate 450 preferably is the SYNC STAT signal 406 for the respective channel of which gate 450 is a part, while the other input ("the cascade input") of AND gate 450 preferably is the output of AND gate 450 of the immediately preceding channel. For the first channel, the cascade input is held high.

It can be seen that the output of AND gate 450 of the last channel will be high—i.e., a logic "1"—only if the SYNC STAT signals 406 of every channel in the cascade are high. If any one of them is low—i.e., a logic "0"—the output of the of AND gate 450 of the last channel will be low. Thus, the output of AND gate 450 in the last channel—i.e., the output of synchronization cascade circuitry 45—is an indicator of whether or not each channel has achieved synchronization. If each channel has achieved synchronization, then it is appropriate to begin reading the contents of the various FIFOs 405.

This is accomplished by conducting the cascade output to repeater line 410 through synchronizer 408 and tristate buffer 409. Each channel preferably has a synchronizer 408 and tristate buffer 409 because, as discussed below, any channel could be the last channel in the cascade, so that the output of that channel's AND gate 450 would be the cascade output. Therefore, the facility to conduct that output to repeater line 410 preferably should be available. For whichever channel is the last in the cascade—here, channel 43—the cascade output is allowed to propagate onto repeater line 410 by enabling tristate buffer 409 of that channel at input 411. In addition, the recovered clock signal 401 of that channel preferably is connected (see conductor segment 412) to a clock tree 419, preferably in the programmable logic core of PLD 10. That clock 401 thus propagated preferably is used not only to read the various FIFOs 405 but also to clock the cascade output itself onto repeater line 410 through synchronizer 408.

By this arrangement, the cascade output is conducted by repeater line 410 and connections 413 to the read enable inputs of each FIFO 405 in the cascade. While each FIFO 405 is clocked for writing by the respective recovered clock 401 of its respective channel, the clocks 401 of the different channels are asynchronous with one another. Therefore, for synchronous reading of FIFOs 405, a single clock preferably is used. Specifically, clock 401 of the last channel in the cascade, conducted to FIFO 405 of each channel by clock tree 419, preferably is used as the single FIFO read clock for all channels.

Repeaters 414 in repeater line 410, and multiplexers 415 on the respective cascade input of each AND gate 450, are provided to allow selection of which channels to group in the cascade. Because serial interface 20 is part of a PLD, the way in which it will be used may differ from one user configuration to another. In any particular configuration, only certain channels may be used. Repeaters 414 can be configured to pass or block signals in either direction, allowing propagation of the cascade output to be confined to the selected channels, even if the selected channels are a group of channels bounded on both sides by other channels that are not included in the group. Similarly, by configuring one of multiplexers 415, using configuration bit 418, to select its permanently high input 416, rather than its cascade input 417, all channels "above" the channel in which the multiplexer is so configured are effectively eliminated from the cascade, because their cascade output will be ignored.

As far as channels below the selected channels are concerned, the cascade output will continue to propagate to those additional channels. However, if those channels are not in use, it will not matter. And if those channels are in use, multiplexer 415 in the first of those channels can be configured to ignore the cascade output of the grouping above. Thus it is seen that any set of contiguous channels may be grouped in this way. Indeed, it will be appreciated that more than one set of contiguous channels may be grouped into separate groups if desired.

Figure 5:
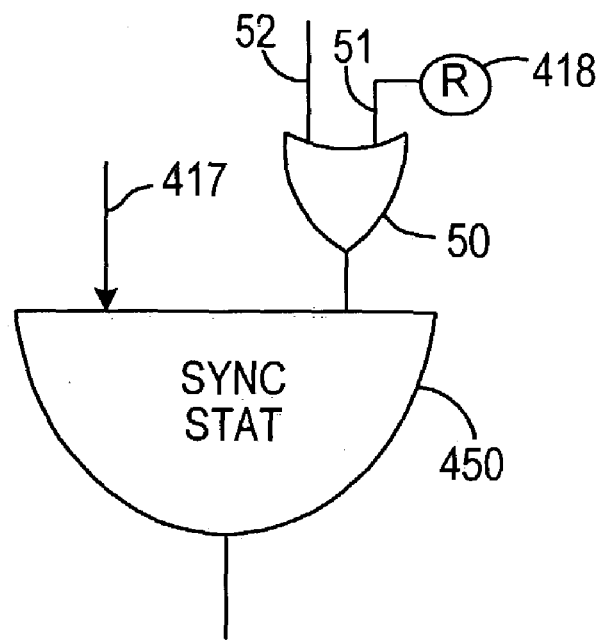
FIG. 5 is a schematic diagram of an alternate component arrangement of the embodiment of FIG. 4.
Figure 7:
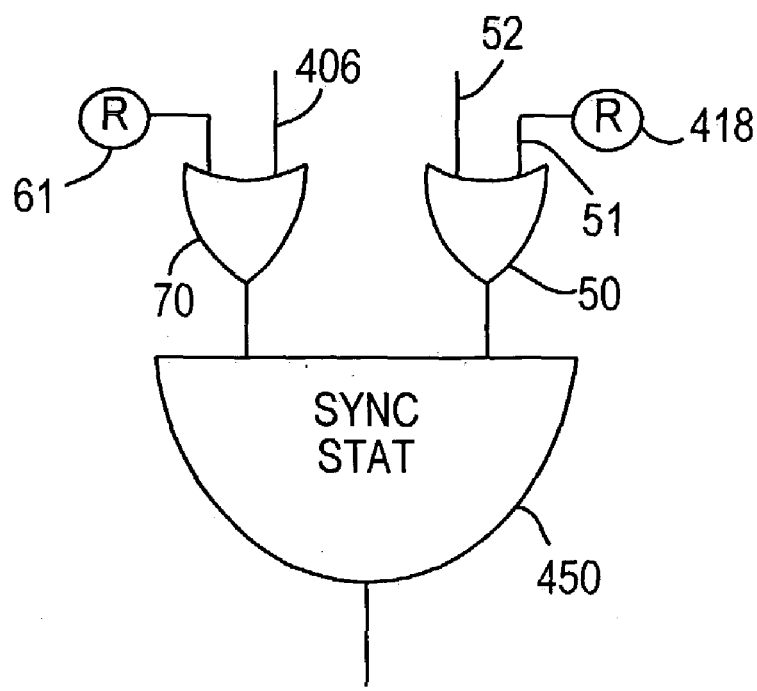
FIG. 7 is a schematic diagram of an alternate component arrangement of the embodiment of FIG. 6.
Figure 6:
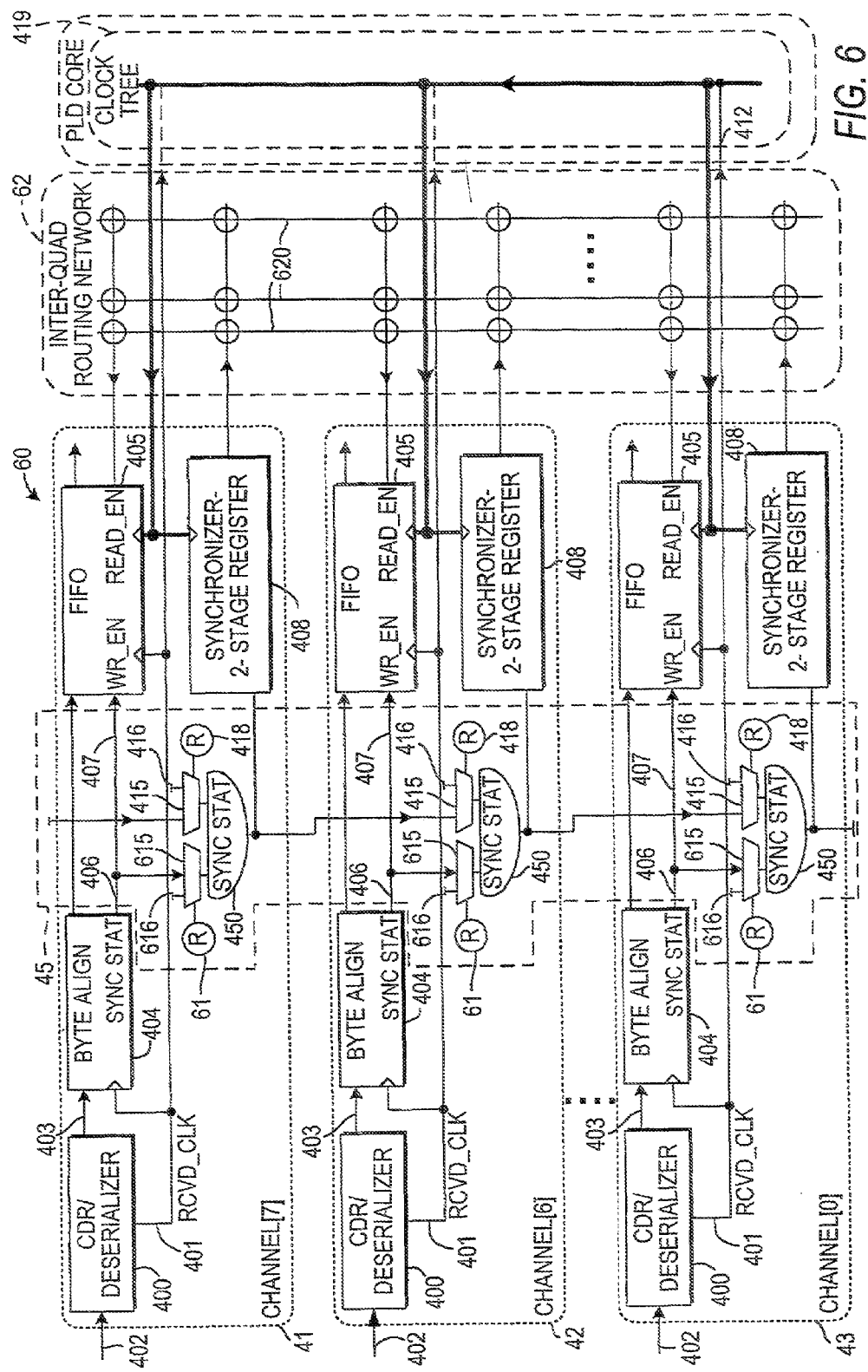
FIG. 6 is a schematic diagram of a second preferred embodiment of a receiver of the serial interface of FIG. 3.

As seen in FIG. 5, instead of multiplexer 415, an OR gate 50 may be used, with configuration bit 418 as one of its inputs 51 and the cascade output of the previous channel as its other input 52.

Although the embodiment shown in FIGS. 4 and 5 allows more than one set of channels to be grouped, any grouping must be of contiguous channels. A second preferred embodiment 60 shown in FIGS. 6 and 7 allows noncontiguous channels to be grouped. In this embodiment, each AND gate 450 not only has multiplexer 415 on its cascade input, but also has multiplexer 615 on its channel input. Multiplexer 615 may be configured by configuration bit 61 to select either SYNC STAT signal 406 or a permanently high input 616. Selection of input 616 would allow that particular channel to be ignored in the cascade, thereby excluding that channel from the group. Alternatively, multiplexer 615 may be replaced by an OR gate 70 having as inputs SYNC STAT signal 406 and configuration bit 61 (see FIG. 7).

In addition, in embodiment 60 tristate buffers 409, and repeater line 410 and repeaters 414, preferably are replaced by a routing network 62, in which conductors 620 are switchably connected to the read-enable inputs of FIFOs 405 and to the outputs of synchronizers 408. This allows any synchronizer output to be connected to any FIFO read-enable input, thereby allowing noncontiguous groupings. Moreover, if multiple cascades (not shown) of AND gates 450 are provided, those multiple cascades, along with multiple conductors 620, would allow multiple noncontiguous groupings. However, with only a single cascade, as shown, only one noncontiguous grouping is possible.

Figure 8:
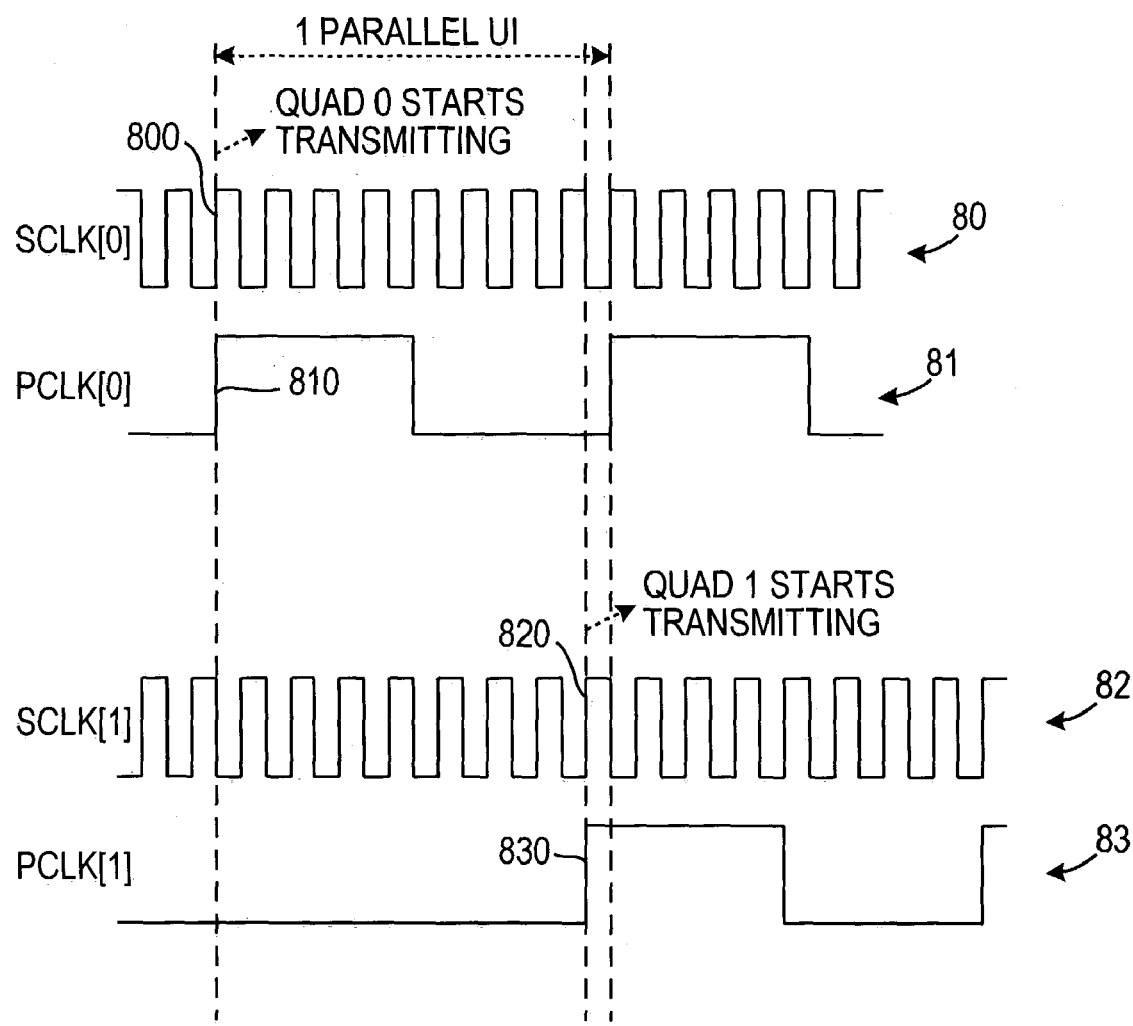
FIG. 8 is a timing diagram representing an alignment problem requiring transmitter synchronization according to the present invention.

FIG. 8 shows the effect of the transmitters of various quads in a serial interface being completely asynchronous. Waveforms 80 and 81 show, respectively, the high-speed serial clock from the transmit PLL of a first quad, and the slower parallel clock divided down from the serial clock. The first rising edge 810 of parallel clock 81 occurs substantially simultaneously with the first rising edge 800 of serial clock 80 after at least one of the transmitters in that first quad is ready to transmit. Transmission begins on rising edge 810. Similarly, waveforms 82 and 83 show, respectively, the high-speed serial clock from the transmit PLL of a second quad, and the slower parallel clock divided down from the serial clock. The first rising edge 830 of parallel clock 83 occurs substantially simultaneously with the first rising edge 820 of serial clock 82 after at least one of the transmitters in that second quad is ready to transmit. As can be seen, because the transmitters of the two quads are completely asynchronous, the second quad does not begin transmitting until almost a full parallel period (unit interval) after the first quad begins transmitting. In applications where a plurality of quads are used together, this is not acceptable.

Figure 9:
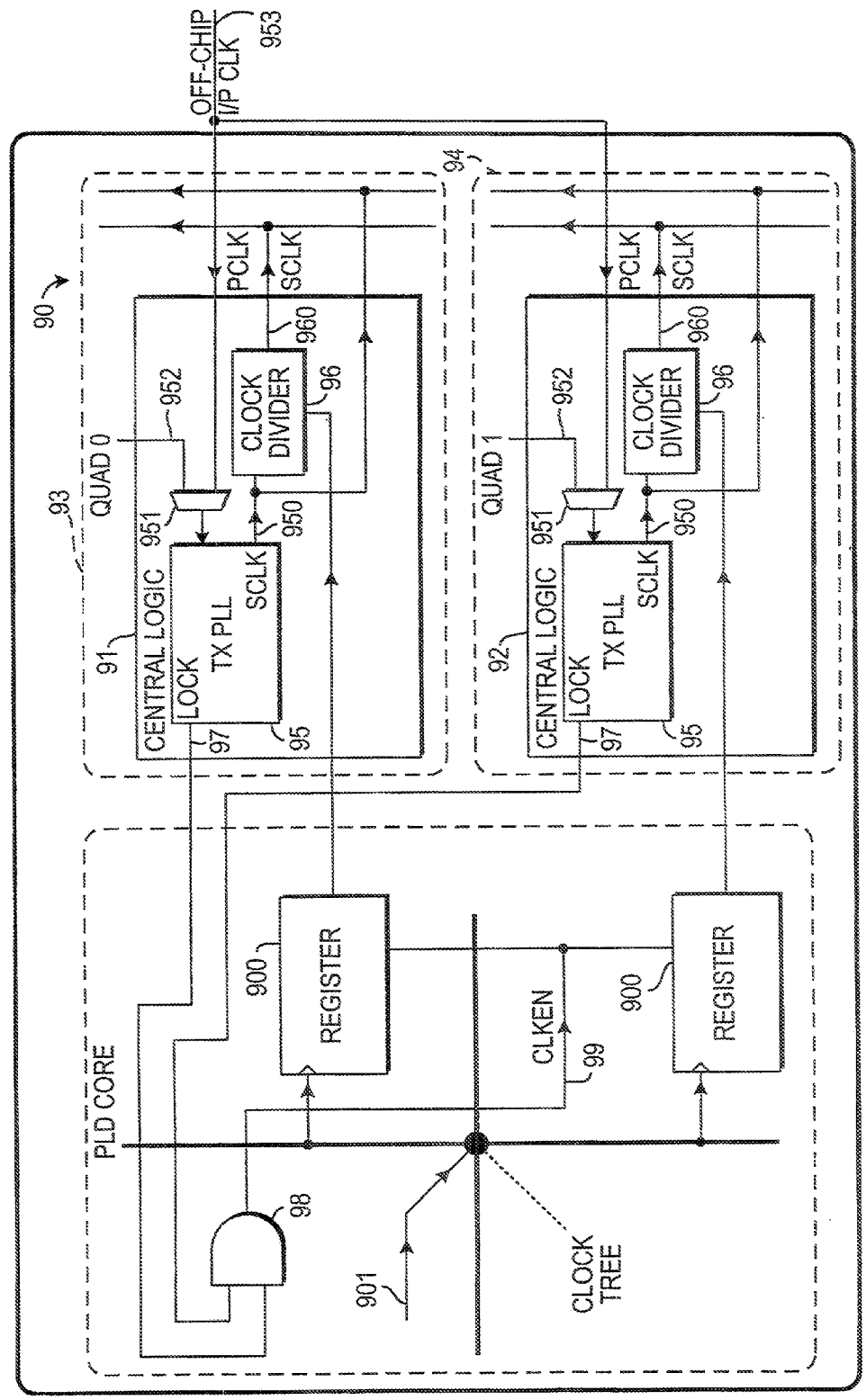
FIG. 9 is a schematic diagram of a first preferred embodiment of a transmitter of the serial interface of FIG. 3.

FIG. 9 shows a first embodiment 90 of a transmitter portion of an interface according to the present invention in which several quads begin transmitting within one serial unit interval of each other. In FIG. 9, the central logic blocks 91, 92 of two quads 93, 94 are shown to contain, inter alia, a transmit PLL 95 that produces a high-speed serial clock 950, and a clock divider 96 that produces from high-speed serial clock 950 a slower parallel clock 960 whose period, or unit interval, preferably is an integral multiple of the serial unit interval of clock 950. In addition, each transmit PLL 95 has a reference input multiplexer 951 that selects an input reference 952 from elsewhere in PLD 10, such as from the programmable logic core, or from an off-chip source 953 common to both (or all, in the case of more than two) quads. Where the two quads are being used independently, it is not important that the transmit PLL reference clocks be the same, but where they are to be used together, it is preferable, if the quads are to operate synchronously, that the reference clocks be the same.

Each transmit PLL 95 preferably has a lock output 97 that signals that the PLL 95 has locked. Preferably, the lock outputs 97 of all quads that are to be synchronized are input to an n-input AND gate 98, where n is the number of quads. Preferably, AND gate 98 is configured from programmable logic in the programmable logic core of PLD 10. The output of AND gate 98 preferably is used as a clock-enable signal 99 to enable all clock dividers 96 to provide each quad with its parallel transmit clock, which would allow each quad to begin transmitting.

Thus in operation, the transmit PLL 95 of each quad would begin operating when conditions in its quad called for such operation, and a lock signal 97 would be output from that quad to AND gate 98. The PLL would continue to provide serial clock 950, but the transmitters in that quad would not yet transmit for lack of parallel clock 960. As PLL 95 of each quad became active, eventually, all inputs to AND gate 98 would be high, and clock-enable signal 99 would go high, enabling all clock dividers 96 to provide parallel clocks 960 so that all quads could begin transmitting.

In order for the respective quads to receive clock-enable signal 99 as simultaneously as possible, so that they begin transmitting as simultaneously as possible, registers 900 preferably are provided in the programmable logic core as close as possible physically to the respective quads and clock-enable signal 99 preferably is registered in registers 900. Registers 900 preferably are clocked by a low-skew global clock 901 of PLD 10 so that all registers 900 are triggered to release clock-enable signal 99 to their respective clock dividers 96 substantially simultaneously. Care need only be taken that all of registers 900 are close enough to AND gate 98 that clock-enable signal 99 reaches all registers 900 within one period of clock 901.

Figure 10:
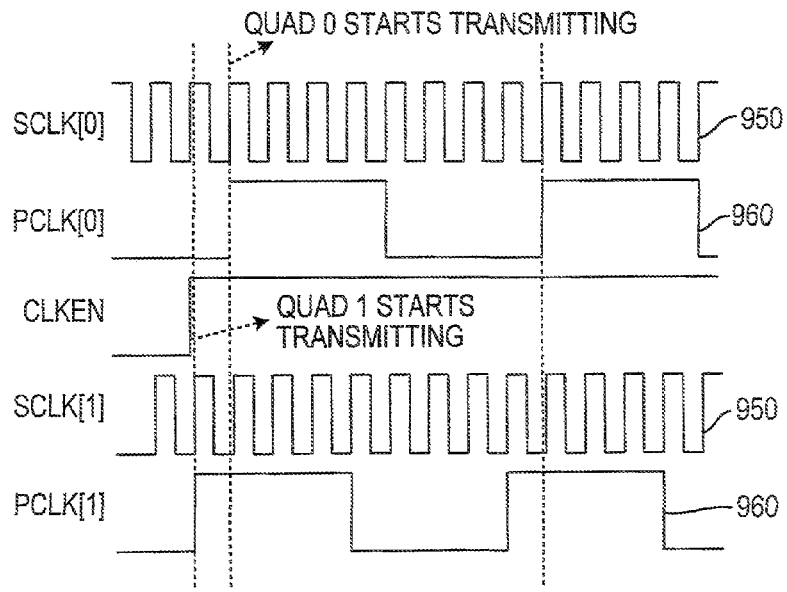
FIG. 10 is a timing diagram representing a solution to the alignment problem of FIG. 8 as provided by the present invention.

However, the various quads are still asynchronous, and the various PLLs 95 will begin providing serial clocks 950 asynchronously, although preferably with a common serial unit interval as a result of the common reference clock 953. Therefore, although all clock dividers 96 preferably receive clock-enable signal 99 substantially simultaneously, each clock divider 96 will wait until the next rising edge of its respective serial clock 950 before beginning to provide its respective parallel clock 960. Therefore, as illustrated in FIG. 10, the various quads may not begin transmitting perfectly simultaneously, but nevertheless will all begin transmitting within one serial unit interval.

Figure 11:
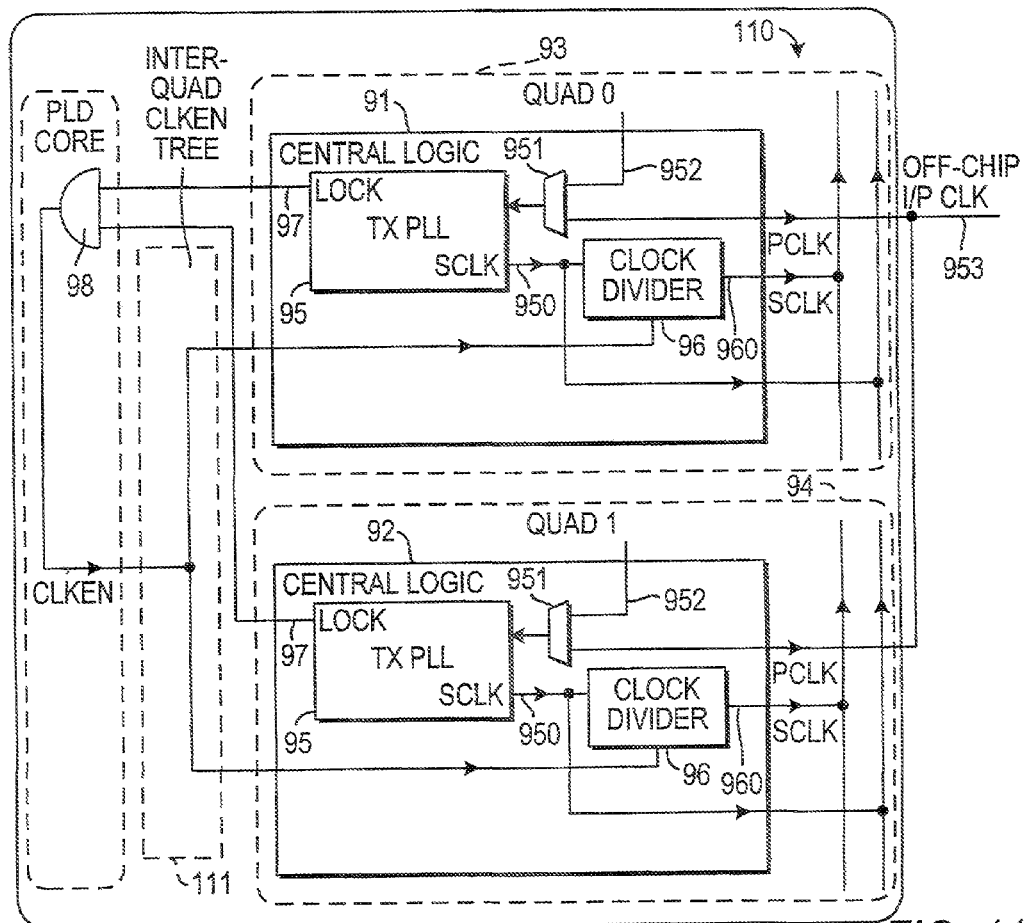
FIG. 11 is a schematic diagram of a second preferred embodiment of a transmitter of the serial interface of FIG. 3.

FIG. 11 shows an alternative embodiment 110 of a transmitter portion of an interface according to the present invention in which several quads begin transmitting within one serial unit interval of each other. Embodiment 110 is substantially similar to embodiment 90, except that instead of delivering clock-enable signal 99 to clock dividers 96 by clocking registers 900 with a low-skew clock signal, clock-enable signal 99 is delivered through a balanced clock tree 111 spanning all involved quads, which may be similar to the multiple interface reference clock distribution network described in copending, commonly-assigned U.S. patent application Ser. No. 10/455,773, filed Jun. 4, 2003, which is hereby incorporated by reference in its entirety.

As described, the various quads arranged in accordance with the present invention will begin transmitting within 1 serial unit interface (1 UI). In addition, there may be up to 0.03 UI of skew introduced by each of (1) PLD clock tree skew giving rise to skew in communicating clock-enable signal 99 to PLLs 95, (2) skew in the transmit serializers, and (3) output buffer delay variation between channels, for total additional skew of up to 0.9 UI, or total skew of up to 1.9 UI. Relevant standards tolerate up to 2 UI of total skew.

Figure 12:
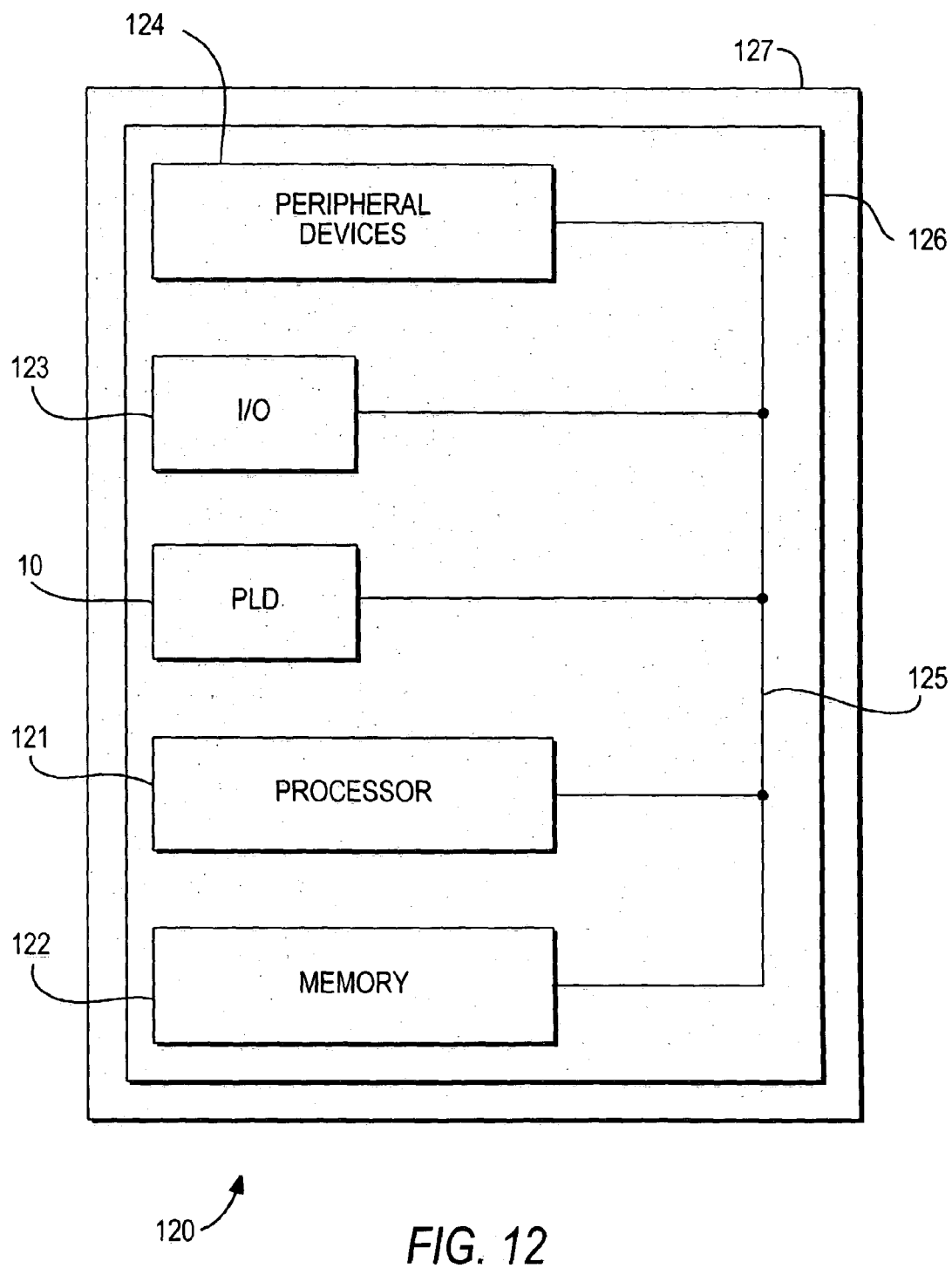
FIG. 12 is a simplified block diagram of an illustrative system employing a programmable logic device incorporating a serial interface in accordance with the present invention.

A PLD 10 incorporating interfaces 20 according to the present invention may be used in many kinds of electronic devices. One possible use is in a data processing system 120 shown in FIG. 12. Data processing system 120 may include one or more of the following components: a processor 121; memory 122; I/O circuitry 123; and peripheral devices 1244. These components are coupled together by a system bus 125 and are populated on a circuit board 126 which is contained in an end-user system 127.

System 120 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 121. PLD 10 may also be used as an arbiter for arbitrating access to a shared resources in system 120. In yet another example, PLD 10 can be configured as an interface between processor 121 and one of the other components in system 120. It should be noted that system 120 is only exemplary, and that the true scope and spirit of the invention should be indicated by the following claims.

Various technologies can be used to implement PLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A serial interface for use in a programmable logic device, said serial interface including:
a plurality of channels, each of said channels communicating between a parallel domain clocked by a parallel clock and a serial domain clocked by a serial clock that is a multiple of said parallel clock, each of said channels comprising at least one receiver for receiving serial data and converting said serial data to parallel data; and
synchronization circuitry that aggregates signals from said plurality of channels and, when all selected ones of said channels are in an active state, initiates communication in each of said selected ones of said channels between said parallel domain and said serial domain; wherein:
each said receiver comprises:
circuitry for converting serial data to parallel data,
a storage device for holding said converted parallel data, and
a status signal generator that generates a status signal indicating that said circuitry for converting has locked on its respective converted parallel data;
said synchronization circuitry comprises status signal cascade circuitry that aggregates said status signals from all selected ones of said receivers and activates reading of respective parallel data from each of said selected ones of said receivers when said aggregated status signals indicate that all of said selected ones of said receivers have locked on their respective converted parallel data;
said status signal cascade circuitry comprises a gate in a respective receiver for combining said status signal of said respective receiver with said status signals of other said respective receivers;
said gate comprises a two-input AND gate;
a first input of said AND gate comprises said status signal of said respective receiver;
a second input of said AND gate comprises an output of an AND gate in another of said receivers, said second input of said AND gate being selectable and further comprising an isolation signal;
selection of said isolation signal removes any receiver above said respective receiver in said cascade from said cascade and thereby from said selected ones of said receivers;
a respective AND gate of one of said receivers is at an end of said cascade circuitry; and
output of said AND gate at said end of said cascade circuitry is an enable signal for enabling reading of the respective storage devices of all said selected ones of said receivers.

2. The serial interface of claim 1 further comprising a multiplexer for making said second input of said AND gate selectable.

3. The serial interface of claim 1 further comprising an OR gate for making said second input of said AND gate selectable.

4. The serial interface of claim 1 wherein:
said first input of said AND gate is selectable and further comprises a bypass signal; whereby:
assertion of said bypass signal in any one of said receivers removes said one of said receivers from said selected ones of said receivers, thereby allowing said selected ones of said receivers to be noncontiguous.

5. The serial interface of claim 4 further comprising a multiplexer for making said first input of said AND gate selectable.

6. The serial interface of claim 4 further comprising an OR gate for making said first input of said AND gate selectable.

7. The serial interface of claim 1 wherein each said receiver further comprises:
a synchronization register, said output of said AND gate being registered in said synchronization register and being read out synchronously under control of a clock signal from elsewhere in said programmable logic device.

8. The serial interface of claim 7 wherein:
said storage device of each said receiver is clocked by said clock signal from elsewhere in said programmable logic device and is enabled by said enable signal; said serial interface further comprising:
an enable signal conductor connected to respective read enable terminals on said storage device of each of said receivers; wherein:
each said synchronization register is selectively connected to said enable signal conductor, said synchronization register at said end of said cascade circuitry being selected for connection to said enable signal conductor; and
said enable signal conductor comprises a repeater between each receiver for limiting said enable signal to said read enable terminals of said selected ones of said receivers.

9. The serial interface of claim 7 wherein:
said storage device of each said receiver is clocked by said clock signal from elsewhere in said programmable logic device and is enabled by said enable signal; said serial interface further comprising:

an enable signal conductor matrix having a plurality of enable signal conductors switchably connected to (a) respective read enable terminals on said storage device of each of said receivers, and (b) respective outputs of said synchronization registers; wherein:
a selected one of said synchronization registers is selected for connection to one of said enable signal conductors; and
selected ones of said read enable terminals are selected for connection to said one of said enable signal conductors; whereby:
a group of receivers encompassing said selected one of said synchronization registers and said selected ones of said read enable terminals is formed, said group being enabled by said enable signal.

10. The serial interface of claim 9 wherein receivers in said group are connected without regard to contiguity of said receivers.

11. The serial interface of claim 10 wherein:
a selected other one of said synchronization registers is selected for connection to another one of said enable signal conductors; and
selected other ones of said read enable terminals are selected for connection to said other one of said enable signal conductors; whereby:
another group of receivers encompassing said selected other one of said synchronization registers and said selected other ones of said read enable terminals is formed, said another group being enabled by another said enable signal.

12. The serial interface of claim 9 wherein:
a selected other one of said synchronization registers is selected for connection to another one of said enable signal conductors; and
selected other ones of said read enable terminals are selected for connection to said other one of said enable signal conductors; whereby:
another group of receivers encompassing said selected other one of said synchronization registers and said selected other ones of said read enable terminals is formed, said another group being enabled by another said enable signal.

13. The serial interface of claim 9 wherein said selected ones of said receivers are contiguous.

14. The serial interface of claim 1 wherein said selected ones of said receivers are contiguous.

15. The serial interface of claim 1 wherein said selected ones of said receivers are noncontiguous.

16. The serial interface of claim 1 wherein:
said status signal cascade circuitry extends across a plurality of said channels, whereby said selected ones of said receivers are in more than one of said channels.

17. A programmable logic device comprising the serial interface of claim 1.

18. A digital processing system comprising:
processing circuitry;
a memory coupled to said processing circuitry; and
a programmable logic device as defined in claim 17 coupled to the processing circuitry and the memory.

19. A printed circuit board on which is mounted a programmable logic device as defined in claim 17.

20. The printed circuit board defined in claim 19 further comprising:
memory circuitry mounted on the printed circuit board and coupled to the programmable logic device.

21. The printed circuit board defined in claim 20 further comprising:

processing circuitry mounted on the printed circuit board and coupled to the memory circuitry.

22. A serial interface for use in a programmable logic device, said serial interface including a plurality of channels, each of said channels communicating between a parallel domain clocked by a parallel clock and a serial domain clocked by a serial clock that is a multiple of said parallel clock, each of said channels comprising:
at least one transmitter for converting parallel data to serial data and transmitting said serial data,
a common serial clock source for all said at least one transmitter, and
a clock divider for converting said common serial clock source to a parallel clock; said serial interface further comprising:
synchronization circuitry that aggregates signals from said plurality of channels and, when all desired ones of said channels are in an active state, initiates communication in each of said desired ones of said channels between said parallel domain and said serial domain; wherein:
said common serial clock source comprises a status signal generator that generates a status signal indicating that said common serial clock source has locked on a reference signal;
said synchronization circuitry comprises status signal combining circuitry that aggregates said status signals from all said desired ones of said channels and activates said clock divider in each of said desired ones of said channels with an activation signal when said aggregated status signals indicate that said respective common serial clock sources in all of said desired ones of said channels have locked on their respective references; and
said serial interface further comprises distribution circuitry for delivering said activation signal to all said channels within two unit intervals of said common serial clock source.

23. The serial interface of claim 22 wherein:
said status signal combining circuitry comprises a multiple-input AND gate; and
each of said desired ones of said channels contributes its respective status signal as an input to said AND gate.

24. The serial interface of claim 23 wherein said multiple-input AND gate is configured from programmable logic in said programmable logic device.

25. The serial interface of claim 22 wherein said status signal combining circuitry is configured from programmable logic in said programmable logic device.

26. The serial interface of claim 22 wherein:
said distribution circuitry comprises a respective register in said programmable logic device for each respective one of said channels;
said respective register is adjacent said respective channel; and
all said respective registers are clocked by a low-skew global clock signal of said programmable logic device.

27. The serial interface of claim 22 wherein:
said distribution circuitry comprises an activation signal distribution network for distributing said activation signal from said status signal combining circuitry to said clock divider in each of said desired ones of said channels.

28. The serial interface of claim 27 wherein said activation signal distribution network is a balanced tree configured to equalize skew of said activation signal between said status signal combining circuitry and said clock divider in each of said desired ones of said channels.

29. The serial interface of claim 22 wherein:
said common serial clock source in each of said channels requires an input reference clock; said serial interface further comprising:
a reference clock distribution network for receiving said input reference clock and distributing said input reference clock to said common serial clock source in each of said desired ones of said channels.

30. The serial interface of claim 29 wherein:
said reference clock distribution network comprises an input for receiving said input reference clock from one of (a) elsewhere on said programmable logic device, and (b) externally of said programmable logic device.

31. The serial interface of claim 29 wherein said common serial clock source comprises a phase-locked loop circuit.

32. A programmable logic device comprising the serial interface of claim 22.

33. A digital processing system comprising:
processing circuitry;
a memory coupled to said processing circuitry; and
a programmable logic device as defined in claim 32 coupled to the processing circuitry and the memory.

34. A printed circuit board on which is mounted a programmable logic device as defined in claim 32.

35. The printed circuit board defined in claim 34 further comprising:
memory circuitry mounted on the printed circuit board and coupled to the programmable logic device.

36. The printed circuit board defined in claim 35 further comprising:
processing circuitry mounted on the printed circuit board and coupled to the memory circuitry.

37. A programmable logic device comprising:
a programmable logic core; and
a serial interface, said serial interface including a plurality of channels, each of said channels communicating between a parallel domain clocked by a parallel clock and a serial domain clocked by a serial clock that is a multiple of said parallel clock, said serial interface further comprising:
synchronization circuitry that aggregates signals from said plurality of channels and, when all selected ones of said channels are in an active state, initiates communication in each of said selected ones of said channels between said parallel domain and said serial domain; wherein:
each of said channels comprises at least one receiver for receiving serial data and converting said serial data to parallel data;
each said receiver comprises:
circuitry for converting serial data to parallel data,
a storage device for holding said converted parallel data, and
a status signal generator that generates a status signal indicating that said circuitry for converting has locked on its respective converted parallel data;
said synchronization circuitry comprises status signal cascade circuitry that aggregates said status signals from all selected ones of said receivers and activates reading of respective parallel data from each of said selected receivers when said aggregated status signals indicate that all of said selected ones of said receivers have locked on their respective converted parallel data;

said status signal cascade circuitry comprises a gate in a respective receiver for combining said status signal of said respective receiver with said status signals of other said respective receivers;

said gate comprises a two-input AND gate;

a first input of said AND gate comprises said status signal of said respective receiver;

a second input of said AND gate comprises an output of an AND gate in another of said receivers, said second input of said AND gate being selectable and further comprising an isolation signal;

selection of said isolation signal removes any receiver above said respective receiver in said cascade from said cascade and thereby from said selected ones of said receivers;

a respective AND gate of one of said receivers is at an end of said cascade circuitry; and output of said AND gate at said end of said cascade circuitry is an enable signal for enabling reading of the respective storage devices of all said selected ones of said receivers.

38. The programmable logic device of claim 37 further comprising a multiplexer for making said second input of said AND gate selectable.

39. The programmable logic device of claim 37 further comprising an OR gate for making said second input of said AND gate selectable.

40. The programmable logic device of claim 37 wherein:
said first input of said AND gate is selectable and further comprises a bypass signal; whereby:
assertion of said bypass signal in any one of said receivers removes said one of said receivers from said selected ones of said receivers, thereby allowing said selected ones of said receivers to be noncontiguous.

41. The programmable logic device of claim 40 further comprising a multiplexer for making said first input of said AND gate selectable.

42. The programmable logic device of claim 40 further comprising an OR gate for making said first input of said AND gate selectable.

43. The programmable logic device of claim 37 wherein each said receiver further comprises:
a synchronization register, said output of said AND gate being registered in said synchronization register and being read out synchronously under control of a clock signal from said programmable logic core.

44. The programmable logic device of claim 43 wherein:
said storage device of each said receiver is clocked by said clock signal from said programmable logic core and is enabled by said enable signal; said serial interface further comprising:
an enable signal conductor connected to respective read enable terminals on said storage device of each of said receivers; wherein:
each said synchronization register is selectively connected to said enable signal conductor, said synchronization register at said end of said cascade circuitry being selected for connection to said enable signal conductor; and
said enable signal conductor comprises a repeater between each receiver for limiting said enable signal to said read enable terminals of said selected ones of said receivers.

45. The programmable logic device of claim 43 wherein:
said storage device of each said receiver is clocked by said clock signal from said programmable logic core and is enabled by said enable signal; said serial interface further comprising:
an enable signal conductor matrix having a plurality of enable signal conductors switchably connected to (a) respective read enable terminals on said storage device of each of said receivers, and (b) respective outputs of said synchronization registers; wherein:
a selected one of said synchronization registers is selected for connection to one of said enable signal conductors; and
selected ones of said read enable terminals are selected for connection to said one of said enable signal conductors; whereby:
a group of receivers encompassing said selected one of said synchronization registers and said selected ones of said read enable terminals is formed, said group being enabled by said enable signal.

46. The programmable logic device of claim 45 wherein receivers in said group are connected without regard to contiguity of said receivers.

47. The programmable logic device of claim 46 wherein:
a selected other one of said synchronization registers is selected for connection to another one of said enable signal conductors; and
selected other ones of said read enable terminals are selected for connection to said other one of said enable signal conductors; whereby:
another group of receivers encompassing said selected other one of said synchronization registers and said selected other ones of said read enable terminals is formed, said another group being enabled by another said enable signal.

48. The programmable logic device of claim 45 wherein:
a selected other one of said synchronization registers is selected for connection to another one of said enable signal conductors; and
selected other ones of said read enable terminals are selected for connection to said other one of said enable signal conductors; whereby:
another group of receivers encompassing said selected other one of said synchronization registers and said selected other ones of said read enable terminals is formed, said another group being enabled by another said enable signal.

49. The programmable logic device of claim 45 wherein said selected ones of said receivers are contiguous.

50. The programmable logic device of claim 37 wherein said selected ones of said receivers are contiguous.

51. The programmable logic device of claim 37 wherein said selected ones of said receivers are noncontiguous.

52. The programmable logic device of claim 37 wherein:
said status signal cascade circuitry extends across a plurality of said channels, whereby said selected ones of said receivers are in more than one of said channels.

53. A digital processing system comprising:
processing circuitry;
a memory coupled to said processing circuitry; and
a programmable logic device as defined in claim 37 coupled to the processing circuitry and the memory.

54. A printed circuit board on which is mounted a programmable logic device as defined in claim 37.

55. The printed circuit board defined in claim 54 further comprising:

memory circuitry mounted on the printed circuit board and coupled to the programmable logic device.

56. The printed circuit board defined in claim 55 further comprising:
processing circuitry mounted on the printed circuit board and coupled to the memory circuitry.

57. A programmable logic device comprising:
a programmable logic core; and
a serial interface, said serial interface including a plurality of channels, each of said channels communicating between a parallel domain clocked by a parallel clock and a serial domain clocked by a serial clock that is a multiple of said parallel clock, wherein:
each of said channels comprises:
at least one transmitter for converting parallel data to serial data and transmitting said serial data,
a common serial clock source for all said at least one transmitter, and
a clock divider for converting said common serial clock source to a parallel clock; said serial interface further comprising:
synchronization circuitry that aggregates signals from said plurality of channels and, when all desired ones of said channels are in an active state, initiates communication in each of said desired ones of said channels between said parallel domain and said serial domain; wherein:
said common serial clock source comprises a status signal generator that generates a status signal indicating that said common serial clock source has locked on a reference signal;
said synchronization circuitry comprises status signal combining circuitry that aggregates said status signals from all said desired ones of said channels and activates said clock divider in each of said desired ones of said channels with an activation signal when said aggregated status signals indicate that said respective common serial clock sources in all of said desired ones of said channels have locked on their respective references; and
said serial interface further comprises distribution circuitry for delivering said activation signal to all said channels within two unit intervals of said common serial clock source.

58. The programmable logic device of claim 57 wherein:
said status signal combining circuitry comprises a multiple-input AND gate; and
each of said desired ones of said channels contributes its respective status signal as an input to said AND gate.

59. The programmable logic device of claim 58 wherein said multiple-input AND gate is configured from programmable logic in said programmable logic core.

60. The programmable logic device of claim 57 wherein said status signal combining circuitry is configured from programmable logic in said programmable logic core.

61. The programmable logic device of claim 57 wherein:
said distribution circuitry comprises a respective register in said programmable logic core for each respective one of said channels;
said respective register is adjacent said respective channel; and
all said respective registers are clocked by a low-skew global clock signal of said programmable logic device.

62. The programmable logic device of claim 57 wherein:
said distribution circuitry comprises an activation signal distribution network for distributing said activation signal from said status signal combining circuitry to said clock divider in each of said desired ones of said channels.

63. The programmable logic device of claim 62 wherein said activation signal distribution network is a balanced tree configured to equalize skew of said activation signal between said status signal combining circuitry and said clock divider in each of said desired ones of said channels.

64. The programmable logic device of claim 57 wherein:
said common serial clock source in each of said channels requires an input reference clock; said serial interface further comprising:
a reference clock distribution network for receiving said input reference clock and distributing said input reference clock to said common serial clock source in each of said desired ones of said channels.

65. The programmable logic device of claim 64 wherein:
said reference clock distribution network comprises an input for receiving said input reference clock from one of (a) said programmable logic core, and (b) externally of said programmable logic device.

66. The programmable logic device of claim 64 wherein said common serial clock source comprises a phase-locked loop circuit.

67. A digital processing system comprising:
processing circuitry;
a memory coupled to said processing circuitry; and
a programmable logic device as defined in claim 57 coupled to the processing circuitry and the memory.

68. A printed circuit board on which is mounted a programmable logic device as defined in claim 57.

69. The printed circuit board defined in claim 68 further comprising:
memory circuitry mounted on the printed circuit board and coupled to the programmable logic device.

70. The printed circuit board defined in claim 69 further comprising:
processing circuitry mounted on the printed circuit board and coupled to the memory circuitry.

* * * * *